United States Patent [19]

Ballato

[11] Patent Number: 4,542,355
[45] Date of Patent: Sep. 17, 1985

[54] NORMAL COORDINATE MONOLITHIC CRYSTAL FILTER

[75] Inventor: Arthur Ballato, Long Branch, N.J.

[73] Assignee: The United States of America as represented by the Secretary of the Army, Washington, D.C.

[21] Appl. No.: 669,147

[22] Filed: Nov. 7, 1984

[51] Int. Cl.$^4$ .................. H03H 9/56; H03H 9/125
[52] U.S. Cl. ................................. 333/191; 310/360; 310/361; 333/187
[58] Field of Search .................. 333/186–192; 310/360–362, 365–366, 320, 321, 328, 333; 29/25, 35, 594; 331/116 R, 158, 163

[56] References Cited

U.S. PATENT DOCUMENTS

| 3,202,846 | 8/1965 | Ballato et al. | 310/365 X |
| 4,313,071 | 1/1982 | Hermann et al. | 310/365 X |
| 4,499,395 | 2/1985 | Kahan | 310/361 |

OTHER PUBLICATIONS

*Modern Crystal & Mechanical Filters*, D. F. Sheahan and R. A. Johnson, IEEE Press, 1977, Sec. II-A; pp. 192–193.
"Doubly Rotated Thickness Mode Plate Vibrators", W. P. Mason and R. N. Thurston, eds., *Physical Acoustics*, Academic Press, N.Y., 1977; p. 143.

*Primary Examiner*—Marvin L. Nussbaum
*Attorney, Agent, or Firm*—Anthony T. Lane; Jeremiah G. Murray; John T. Rehberg

[57] ABSTRACT

Enhancement of proper phase and insertion loss response, reduction of undesired mode couplings, and greater latitude in the design with respect to energy trapping in filters, in addition to enhancement of the dynamic frequency-temperature compensation, as well as stress-frequency compensation is provided by arranging the electrode gap of a monolithic crystal filter so that it is perpendicular to the projection of the normal coordinate or eigenvector of the mode utilized along with making the side edges of the electrodes parallel to the direction of the normal coordinate projection. For the doubly rotated SC cut of quartz, using the c-mode, the normal coordinate projection angle, i.e. the axis along which the electrodes are aligned, is substantially 8.2° from the rotated plate (X') axis.

16 Claims, 5 Drawing Figures

NORMAL COORDINATE MONOLITHIC CRYSTAL FILTER

The invention described herein may be manufactured and used by or for the Government for governmental purposes without the payment of any royalties thereon or therefor.

FIELD OF THE INVENTION

This invention relates generally to the field of piezoelectric crystal filters and more particularly to a method and means for enhancing proper phase and insertion loss response and reduction of undesired mode couplings, and greater latitude in the design of energy trapped monolithic crystal filters, as well as for compensating for the effects of electrode stresses and/or temperature transients.

BACKGROUND OF THE INVENTION

The use of resonant piezoelectric crystals as monolithic filters is well known, having been described in various publications including a text book entitled, *Modern Crystal And Mechanical Filters*, D. F. Sheahan and R. A. Johnson, EDS, published by the IEEE Press, 1977. Section II-A at pages 192–193 provides an historical overview of such devices and describes the effect of energy trapping, i.e., the confinement of the mechanical vibrating energy of a resonator to the area immediately beneath and between the electrodes.

Furthermore, various cuts of quartz used as monolithic crystal filters are also known. The AT cut of quartz has been extensively used although any singly rotated cut of quartz or other material such as berlinite ($AlPO_4$) can be used. Recently, however, the use of doubly rotated cuts has been investigated and reported, for example, by the present inventor in Volume 13, Chapter 5, "Doubly Rotated Thickness Mode Plate Vibrators", of a text book entitled, *Physical Acoustics*, (W. B. Mason and R. N. Thurston, EDS), Academic Press, New York, 1977, pp. 115–181. An inherent problem exists with doubly rotated monolithic crystal filters using SC cuts of quartz in that the direction of the projection, in the plane of the plate, of the particle motion (normal coordinate) also referred to as the eigenvector projection, of the desired mode producing the filter response is at an angle relative to the doubly rotated axes in the plane of the plate. This has the effect of producing undesired mode couplings, improper phase and insertion loss responses, as well as providing less latitude of the design with respect to energy trapping in filters.

Accordingly, it is an object of the present invention to provide an improvement in piezoelectric crystal filters.

It is a further object of the invention to provide a piezoelectric monolithic crystal filter having improved frequency selectivity.

It is another object of the present invention to provide a monolithic crystal filter which is compensated for frequency shifts over a prolonged length of time resulting from the effects of electrode stress.

It is yet another object of the invention to provide a monolithic crystal filter which is compensated for bandwidth and insertion loss changes resulting from temperature transients over relatively short time periods.

It is yet a further object of the invention to provide for an improvement in the operational characteristics of monolithic crystal filters using doubly rotated plates of piezoelectric material.

And still a further object of the invention is to provide for improved monolithic crystal filters using an SC cut of quartz.

SUMMARY

Briefly, the foregoing and other objects of the invention are provided by the method and means for reducing the undesired mode couplings, improper phase and insertion loss responses as well as compensating for stress and transient temperature effects on the SC cut of quartz, for example, by aligning the electrode length, including the sides thereof, fabricated on the surfaces of the crystal plate along the direction of projection of the eigenvector (the normal coordinate), and, in the case of trapped energy monolithic filter, arranging the electrode gap so that the gap is perpendicular to the eigenvector projection. For the SC cut of quartz operating in the shear mode (c-mode) the projection angle of the eigenvector as well as the direction of the electrodes is at an angle of approximately 8.2° from the $X'$ axis of the doubly rotated cut.

BRIEF DESCRIPTION OF THE DRAWINGS

While the present invention is defined in the claims annexed to and forming a part of the specification, a better understanding can be had by reference to the following description when taken in conjunction with the accompanying drawings in which:

DESCRIPTION OF THE PREFERRED EMBODIMENT

Figure 1:
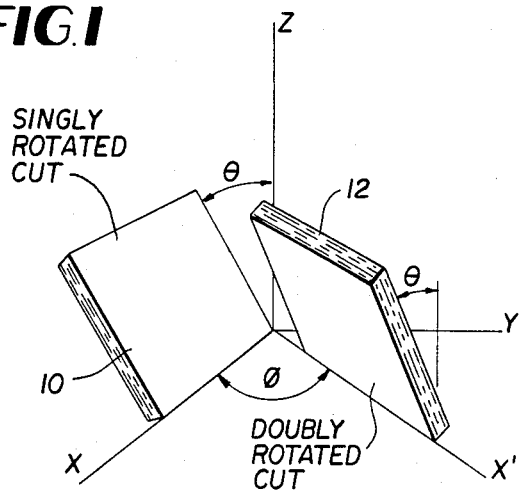
FIG. 1 is a diagram illustrative of singly rotated and doubly rotated cut quartz crystal resonator plates oriented in relation to their crystallographic axes.

Referring now to the drawings and more particularly to FIG. 1, shown thereat is a set of mutually perpendicular X, Y and Z axes which, as is well known, defines the crystallographic axes of piezoelectric crystals according to the right handed rectangular cartesian coordinate system. For quartz, the X axis represents the electrical axis, the Y axis represents the mechanical axis, and the Z axis represents the optical axis. In FIG. 1, two relatively thin blanks or plates 10 and 12 are shown for the purpose of illustrating the distinction between well known singly and doubly rotated cuts of quartz. A singly rotated cut plate 10 has its major faces oriented at a polar angle $\theta$ with respect to the Z (optical) axis, while the doubly rotated cut plate 12 includes not only the rotation angle $\theta$ but also a rotation of the X axis to an angle $X'$ by a second angle $\phi$. Accordingly, a doubly rotated cut comprises a plate having crystallographic orientations which are a function of both angles $\theta$ and $\phi$. Furthermore, a doubly rotated cut of quartz, known in the art as the SC cut, has been found to be desirable, when used as a piezoelectric plate resonator, because of its ability to compensate for the effects of electrode stresses and/or temperature transients.

When a plate of isotropic material executes extensional motion by becoming alternately thicker or thinner, the direction of particle motion, known as the eigenvector or normal coordinate, is along the thickness direction. If on the other hand the plate slides back and forth in the thickness shear mode, the eigenvector is perpendicular to the thickness and in the direction of the motion of the shear.

In an anisotropic crystal plate, especially one cut at an arbitrary angle to its crystallographic axes, these motions are inter-coupled so that even when it tries to execute an extensional motion and becomes thicker and thinner, it simultaneously has a shear component. The resultant motion is either along the thickness (extensional) or perpendicular to it (shear). Accordingly, the eigenvector or normal coordinate is skewed. The shear mode will likewise not be a pure shear mode but will be coupled to the extensional mode. In a singly rotated cut of piezoelectric material such as the popular AT cut of quartz, the crystal symmetry of the quartz plate accidentally makes the thickness shear mode a pure mode causing the eigenvector to be perfectly perpendicular to the plate thickness and in the plane of the plate and along the X crystallographic axis. Furthermore, in monolithic crystal filters fabricated on AT plates, the electrodes are either parallel or perpendicular to this axis. In the doubly rotated e.g. the SC cut, however, the lack of symmetry makes the particle motion or eigenvector lie out of the plane of the plate and its projection in the plane of the plate lies at specific angle $\psi$ from the rotated X' axis as shown, for example, in FIG. 3.

Figure 2A:
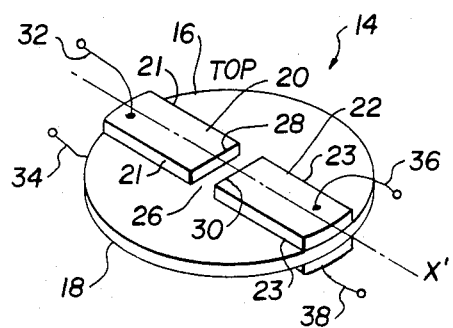
FIG. 2A is a perspective view of the top portion of a known monolithic crystal filter.
Figure 2B:
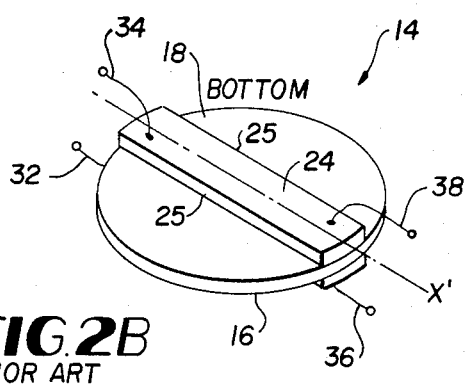
FIG. 2B is a perspective view of the bottom portion of the monolithic crystal filter shown in FIG. 2A.
Figure 2C:
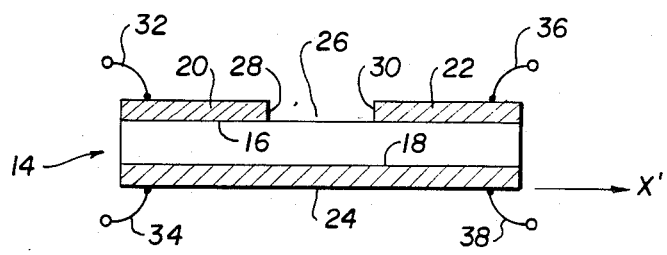
FIG. 2C is a central cross sectional view of the monolithic crystal filter shown in FIGS. 2A and 2B.

This now leads to a consideration of FIGS. 2A through 2C wherein there is shown for purposes of illustration a known prior art monolithic crystal filter comprised of a doubly rotated cut piezoelectric plate 14, such as an SC cut of quartz. The plate 14 as shown is comprised of a substantially constant thickness and having substantially flat top and bottom major faces or surfaces 16 and 18. The device is further shown comprising a trapped energy mode resonator in that it includes a first and second elongated rectangular electrode element 20 and 22 of equal width and having linear side and inner end surfaces formed on the upper surface 16 and a like third continuous electrode 24 formed on the bottom surface 18. The lower electrode 24 is in registration with the two upper electrodes 20 and 22 and may have the same width dimension. Further as shown in FIG. 2A, the two upper electrodes 20 and 22 are separated by an electrode gap 26 which is defined by the opposing inner end surfaces 28 and 30. The width of the gap 26 between the electrodes as well as the electrode dimensions themselves are design parameters determined by well known design rules for such devices. Further as shown, a pair of input signal leads 32 and 34 are respectively connected to the outer portions of one upper electrode 20 and the common bottom electrode 24 while a pair of output signal leads are connected to the outer portion of the other upper electrode 22 and the common bottom electrode 24.

It is significant to note that the device shown in FIGS. 2A, 2B and 2C have the parallel side surfaces 21 of the input electrode 20, the parallel side surfaces 23 of the output electrode 22 and the parallel side surfaces 25 of the common electrode 24 aligned with the X' axis which provides a filter, when operating in the shear or c mode. For doubly rotated cuts in general, and the SC cut in particular, this electrode arrangement provides a particle motion which is at an angle different from the direction of the plate axes. This skewing of the eigenvector with respect to the electrode structure produces undesired mode couplings, improper phase and insertion loss responses and less latitude in the design of a monolithic crystal filter, particularly one comprised of an energy trapping resonator.

Figure 3:
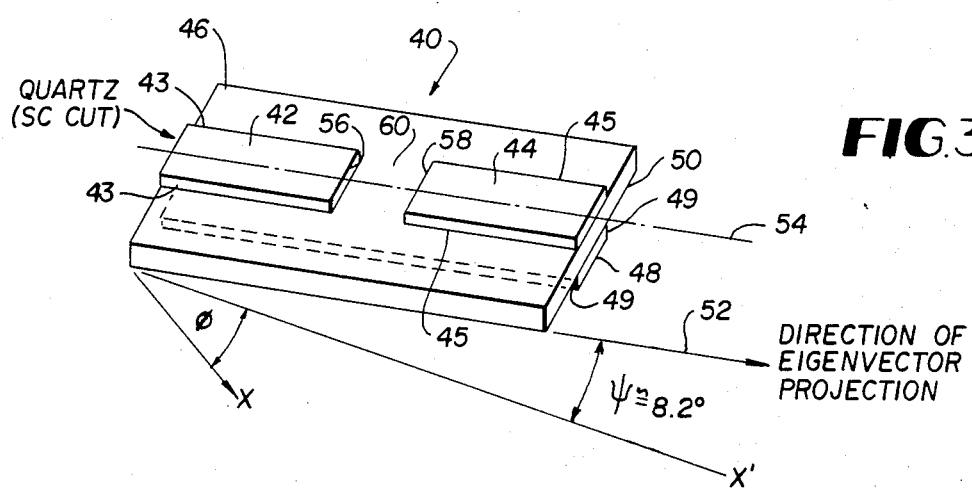
FIG. 3 is a perspective view of a monolithic crystal filter in accordance with the subject invention.

The present invention provides an improvement over monolithic crystal filters fabricated from doubly rotated cuts of piezoelectric material, as shown in FIGS. 2A–2C, simply by aligning the electrode length i.e. the side surfaces thereof, along the direction of the projection of the normal coordinate of the mode, i.e., the eigenvector in the plane of the plate for the desired operating mode. This is illustrated in FIG. 3 wherein a monolithic crystal filter plate 40, comprising an SC cut of quartz, having a first and second electrode 42 and 44 formed on the upper surface 46 and a common electrode 48 formed on the lower surface 50. For the SC cut of quartz, the direction of the eigenvector 52 is skewed at an angle $\psi$ of 8.2° from the X' axis in the slow shear mode or c-mode of operation. The electrodes 42, 44 and 48, moreover, have their respective side surfaces 43, 45 and 49 aligned with the eigenvector direction 52 by being positioned on and parallel to a center line 54 which is likewise parallel to the direction line 52 of the eigenvector projection. Furthermore, the electrode gap 56 is perpendicular to the projection of the eigenvector 52 due to the fact that the opposing end surfaces 56 and 58 of the electrodes 42 and 44 are mutually parallel, and are mutually perpendicular to the center line 54 and the eigenvector projection direction 52. The alignment of the electrodes 42, 44 and 48 along the projection of the desired eigenvector as well as the perpendicular gap end surfaces 56 and 58 makes the phase front of the acoustic waves generated in the plate upon energization parallel to the electrode gap 60. This results in higher energy coupling with lower insertion loss in addition to a reduction in unwanted or spurious modes. Also, this configuration results in further compensation for the effects of electrode stresses and/or temperature transients, the former resulting in frequency shifts with time as aging occurs, while temperature transients produce bandwidth and insertion loss changes over much shorter times. This increased compensation feature can in some instances make the difference between utility and uselessness in narrowband filter applications.

Where a configuration as shown in FIG. 3 employs two electrodes 42 and 44 on the top surface 46 in combination with a common electrode 48 on the bottom surface, one obtains a two-pole filter; however, with additional pairs of in-line electrodes, an n-pole filter can be obtained. The more electrodes utilized, the sharper the response; however, the device becomes more difficult to manufacture and electrode alignment becomes a problem. Accordingly, two-pole monolithic crystal filters are by far the most common. Additionally, instead of a common lower electrode 48 as shown in FIG. 3, one can also provide a gap between a pair of bottom electrode halves identical to the electrodes 42 and 44 located on the top surface of the resonator plate 40.

FIG. 3 shows a monolithic crystal filter fashioned on an SC cut of quartz; the SC cut has a $\phi$ value (FIG. 1) of substantially 21.9°, and a corresponding offset angle $\psi$ between the X' axis and the eigenvector projection of substantially 8.2°. More generally, however, doubly rotated cuts located on the zero temperature coefficient of frequency locus, other than the SC cut, are also suitable for operation as monolithic crystal filters. The most prominent doubly rotated cuts of quartz in this category are listed in Table I, along with the angle ψ between the X' axis and the eigenvector projection.

TABLE I

| CUT | φ (degrees) | ψ (degrees) |
|---|---|---|
| AT | 0 | 0 |
| 5° V | 5 | 1.9 |
| 10° V | 10 | 3.7 |
| 13.9° V | 13.9 | 5.2 |
| FC | 15 | 5.6 |
| IT | 19.1 | 7.2 |
| SC | 21.9 | 8.2 |
| 25° V | 25 | 9.4 |
| 30° V | 30 | 11.4 |

Thus what has been shown and described is an improvement in piezoelectric monolithic crystal filters comprised of doubly rotated cuts of piezoelectric material whereby improved phase and insertion loss response, reduction of undesired mode couplings, and greater design latitude, as well as compensation against frequency shifts resulting from prolonged electrode stress and temperature transients producing bandwidth and insertion loss changes are provided which results in a device having enhanced frequency selectivity. Such devices are particularly adapted for utilization with spread spectrum and fast frequency hopping communication systems.

Having thus shown and described what is at present considered to be the preferred embodiment of the invention, it should be pointed out that the same has been made by way of illustration and not limitation. Accordingly, all alterations, modifications and changes coming within the spirit and scope of the invention as defined in the appended claims are herein meant to be included.

I claim:

1. A pizeoelectric monolithic crystal filter compensated for the effects of electrode stresses and temperature transients, comprising:
   a doubly rotated cut of piezoelectric material formed as a plate-like body having a pair of surfaces comprising opposing major faces; and
   electrode means, substantially aligned with the projection of the eigenvector (normal coordinate) for the desired operating mode, formed on said surfaces in an energy trapping configuration, and including an electrode gap on at least one of said surfaces, said electrode gap being substantially perpendicular to the projection of the eigenvector, said eigenvector or normal coordinate being the direction of particle motion within said body when excited in said desired operating mode.

2. The monolithic crystal filter as defined by claim 1 wherein said doubly rotated cut of piezeolectric material comprises a doubly rotated cut of quartz.

3. The monolithic crystal filter as defined by claim 1 wherein said electrode means comprises elongated electrode means having side surfaces aligned with the projection of said eigenvector.

4. The monolithic crystal filter as defined by claim 1 wherein said electrode means includes first and second elongated electrodes on said one surface and having mutually parallel inner end surfaces perpendicular to said eigenvector projection and separated by a predetermined distance defining said electrode gap.

5. The monolithic crystal filter as defined by claim 4 wherein said first and second elongated electrodes include mutually parallel elongated side surfaces aligned with said eigenvector projection.

6. The monolithic crystal filter as defined by claim 5 wherein said electrode means includes at least a third electrode on the other of said surfaces and being in said substantial registration with said first and second elongated electrodes and having elongated side surfaces also aligned with said eigenvector projection.

7. The monolithic crystal filter as defined by claim 5 and wherein the side surfaces of said first, second and third electrodes are aligned with an axis which is at an angle ψ which is greater than zero and 11.4° or less from a reference axis X' which is rotated a predetermined angle φ from the electrical axis of the crystal, and wherein the angle of rotation φ is greater than zero and equal to or less than 30°.

8. The monolithic crystal filter as defined by claim 7 wherein said doubly rotated cut of piezoelectric material comprises the SC cut of quartz, wherein φ is substantially equal to 21.9° and ψ is substantially equal to 8.2°.

9. A method for compensating a monolithic crystal filter for the effects of electrode stress and temperature transients, comprising the steps of:
   forming a doubly rotated cut of piezoelectric material into a plate-like body having a pair of surfaces comprising opposing major faces; and
   forming electrode means in an energy trapping configuration on said surfaces and forming an electrode gap on at least one of said surfaces, said electrode gap being substantially perpendicular to the projection of the normal coordinate or eigenvector for the desired operating mode of said crystal filter, said normal coordinate or eigenvector being the direction of the particle motion within said body when excited in said desired operating mode.

10. The method as defined by claim 9 wherein said step of forming electrode means additionally comprises forming elongated electrode means in alignment with the projection of said eigenvector.

11. The method as defined by claim 10, wherein said doubly rotated cut of piezoelectric material comprises the SC cut of quartz.

12. The method as defined by claim 10 wherein said step of forming said electrode means includes forming first and second elongated electrodes on said one surface with mutually parallel inner end surfaces perpendicular to said eigenvector projection and being separated by a predetermined distance defining said electrode gap.

13. The method as defined by claim 12 wherein said step of forming said first and second elongated electrode further includes forming elongated substantially linear side surfaces aligned with said eigenvector projection.

14. The method as defined by claim 13 wherein said step of forming electrode means includes forming at least one elongated electrode on the other side of said surfaces, and further forming said at least one electrode in substantial registration with said first and second elongated electrodes and having substantially linear side surfaces also aligned with said eigenvector.

15. The method as defined by claim 10 wherein said step of forming electrode means comprises forming the side surfaces of said elongated electrodes so as to be in alignment with an axis which is at an angle $0° < \psi \leq 11.4°$ from a rotated reference axis which is rotated a predetermined angle φ where $0° < \phi \leq 30°$ from the electrical axis of the crystal.

16. The method as defined by claim 15 wherein said doubly rotated cut of piezoelectric material comprises the SC cut of quartz where $\phi \cong 21.9°$ and $\psi \cong 8.2°$.

* * * * *